(12) United States Patent
Abdul Karim et al.

(10) Patent No.: US 8,138,766 B2
(45) Date of Patent: Mar. 20, 2012

(54) FLASHOVER ANALYSIS TOOL

(75) Inventors: Sazali Abdul Karim, Selangor (MY); Abdullah Asuhaimi Mohd Zin, Johor (MY)

(73) Assignees: TNB Research SDN. BHD., Selangor (MY); University Teknologi Malaysia, Johor (MY)

(*) Notice: Subject to any disclaimer, the term of this patent is extended or adjusted under 35 U.S.C. 154(b) by 349 days.

(21) Appl. No.: 12/445,185

(22) PCT Filed: Oct. 11, 2007

(86) PCT No.: PCT/MY2007/000068
§ 371 (c)(1),
(2), (4) Date: Apr. 10, 2009

(87) PCT Pub. No.: WO2008/063043
PCT Pub. Date: May 29, 2008

(65) Prior Publication Data
US 2010/0073010 A1   Mar. 25, 2010

(30) Foreign Application Priority Data
Oct. 13, 2006   (MY) .................. PI 20064322

(51) Int. Cl.
*G01R 31/02* (2006.01)
*H01H 31/02* (2006.01)
(52) U.S. Cl. ............................ 324/537; 324/555
(58) Field of Classification Search ............ 324/537, 324/500, 76.11, 555; 361/1, 42, 44; 702/125, 702/1, 57, 58, 127, 176, 177, 108
See application file for complete search history.

(56) References Cited

U.S. PATENT DOCUMENTS

| | | | | |
|---|---|---|---|---|
| 5,136,248 A | * | 8/1992 | Maraio et al. | 324/536 |
| 5,352,983 A | * | 10/1994 | Eriksson et al. | 324/522 |
| 5,805,400 A | * | 9/1998 | Kim | 361/71 |
| 6,247,003 B1 | * | 6/2001 | Cummins et al. | 706/22 |
| 6,667,866 B1 | * | 12/2003 | LaPlace et al. | 361/87 |

FOREIGN PATENT DOCUMENTS

KR    1020020076413   * 10/2002

OTHER PUBLICATIONS

English version of KR-1020020076413.*

* cited by examiner

*Primary Examiner* — Hoai-An D Nguyen
(74) *Attorney, Agent, or Firm* — Lowe, Hauptman, Ham & Berner, LLP (57) ABSTRACT

A method to minimize human intervention during decision making processes while controlling an electrical power system by identifying an initiating element that cause a tripping of the transmission overhead lines and identifying potential future protection system failures that can initiate a cascading of tripping or total national blackout. A method of producing flashover analysis signal as a protection system analysis including processing a neutral current, three phase current profile, three phase voltage profile, and a plurality of digital signal of a transmission line using an artificial neural network to calculate pickup time, reset time, DEF confirmation time or total fault clearance time. A method of producing flashover analysis signal including as a flashover signature analysis to identify the cause of the flashover as a current transformer explosion, tree encroachment, crane, lightning strike or polluted insulator.

4 Claims, 8 Drawing Sheets

FLASHOVER ANALYSIS TOOL

RELATED APPLICATIONS

The present application is based on, and claims priority from, International Application PCT/MY2007/000068, filed Oct. 11, 2007 which claims priority from Malaysian Application Number PI 20064322, filed Oct. 13, 2006, the disclosures of which are hereby incorporated by reference herein in their entirety.

The present invention relates to the field of electrical power system. More particularly, the present invention relates to transmission overhead line for electrical power utilities. Most particularly, the present invention relates to a method for analyzing the protection behavior during an overhead line system fault and fault triggering that causes the flashover on an overhead line transmission system which works on the data retrieved from a digital fault recorder.

BACKGROUND TO THE INVENTION

Unplanned electrical power outages are major concerns to power utilities throughout the whole world. Unfortunately, power outage will continue to happen and it cannot be fully prevented. Possible causes for such outages may be due to lightning strikes, tree encroachment or equipment failures. The impact of such incidents not only affects the consumer, but the power provider themselves. These impacts can be greatly reduced if power system operators are equipped with appropriate tools to analyze the root cause of the failure.

At the moment, power providers' record and store digitized information from digital fault recorders installed on each overhead line transmission systems. It is a common routine for an engineer to access each data stored by personally going to each overhead line transmission system.

A typical digital fault recorder stores raw data of three phase electrical signals and the condition of the overhead line transmission system. Each power outages provide a certain flashover signature depending on the cause of the outage. However, the digital fault recorder does not inform the faults which cause the outage. Currently there is no tool which analyses the flashover and identify the cause of the flashover.

It will be therefore desirable to have a system that is able to process the digitized information from the digital fault recorders to identify and notify the cause of the outage. It will also be desirable for a tool to perform decision making with minimal human intervention so as to take appropriate proactive steps or countermeasures.

SUMMARY OF THE INVENTION

The invention is conceived by analyzing flashover behavior stored on digital fault recorder. The electrical signals stored on the digital fault recorder have a distinct signature for every cause of flashover. The electrical signals can be further analyzed to identify fault failures and recommend necessary steps to overcome the electrical outage.

In one aspect of the present invention, there is provided an integrated protection analysis system consisting of a module to analyze protection behavior during an overhead line fault and a module to analyze the fault triggering that causes a flashover on an overhead line transmission.

In a second aspect of the present invention, there is provided a method to utilize the recorders information from transmission lines to map all the power system information during a flashover.

In a third aspect of the present invention, there is provided an artificial neural network used to validate response times against predefined values set by power supplier.

In a fourth aspect of the present invention, there is provided a method to reveal the tripping pattern into practical clusters for discovery of differences.

In a fifth aspect of the present invention, there is provided an expert system to identify the cause of flashovers.

In a sixth aspect of the present invention, there is provided a graphical user interface tool utilizing the internet browser facility to access the system for remote monitoring.

BRIEF DESCRIPTION OF THE DRAWINGS

The invention will now be described in greater detail, by way of an example, with reference to the accompanying drawings, in which.

DETAILED DESCRIPTION OF THE DRAWINGS

The invention involves a protection system analysis (52) to identify the operational behavior of the protection systems components of an overhead line transmission system. A digital fault recorder's information (49) is utilized to record power system information during a flashover. A typical digital fault recorder has at least seven analogue inputs and sixteen digital inputs (8). The data is captured in a matrix form as shown in the analogue and digital matrices below:

Analogue inputs matrix, $$\begin{bmatrix} Ur_0 & Uy_0 & Ub_0 & Ir_0 & Iy_0 & Ib_0 & In_0 \\ Ur_1 & Uy_1 & Ub_1 & Ir_1 & Iy_1 & Ib_1 & In_1 \\ Ur_2 & Uy_2 & Ub_2 & Ir_2 & Iy_2 & Ib_2 & In_2 \\ Ur_3 & Uy_3 & Ub_3 & Ir_3 & Iy_3 & Ib_3 & In_3 \\ \vdots & \vdots & \vdots & \vdots & \vdots & \vdots & \vdots \\ \vdots & \vdots & \vdots & \vdots & \vdots & \vdots & \vdots \\ \vdots & \vdots & \vdots & \vdots & \vdots & \vdots & \vdots \\ \vdots & \vdots & \vdots & \vdots & \vdots & \vdots & \vdots \\ Ur_N & Uy_N & Ub_N & Ir_N & Iy_N & Ib_N & In_N \end{bmatrix}$$

Where $Ur_N$: Red phase voltage at "N" data sampling (1)

$Uy_N$: Yellow phase voltage at "N" data sampling (2)
$Ub_N$: Blue phase voltage at "N" data sampling (3)
$Ir_N$: Red phase current at "N" data sampling (4)
$Iy_N$: Yellow phase current at "N" data sampling (5)
$Ib_N$: Blue phase current at "N" data sampling (6)
$In_N$: Neutral current at "N" data sampling (7)

Digital inputs (8) matrix, $$\begin{bmatrix} D1_0 & D2_0 & D3_0 & \ldots & D16_0 \\ D1_1 & D2_1 & D3_1 & \ldots & D16_1 \\ D1_2 & D2_2 & D3_2 & \ldots & D16_2 \\ D1_3 & D2_3 & D3_3 & \ldots & D16_3 \\ \vdots & \vdots & \vdots & \vdots & \vdots \\ \vdots & \vdots & \vdots & \vdots & \vdots \\ \vdots & \vdots & \vdots & \vdots & \vdots \\ \vdots & \vdots & \vdots & \vdots & \vdots \\ D1_N & D2_N & D3_N & \ldots & D16_N \end{bmatrix}$$

Figure 1:
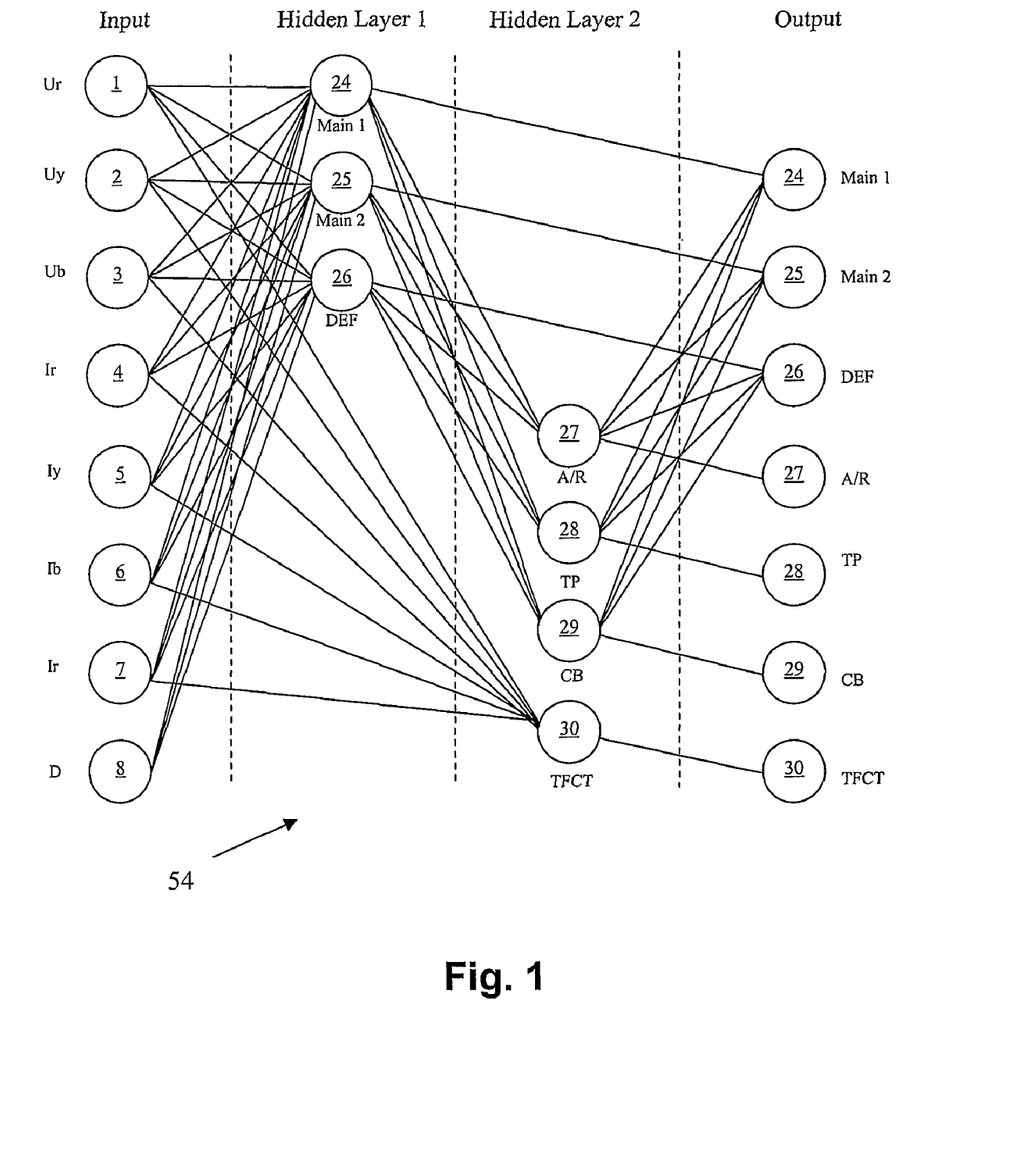
FIG. 1 illustrates an Artificial Neural Network's architecture which is used to calculate the response time and fault clearing time against the predefined values.
Figure 2:
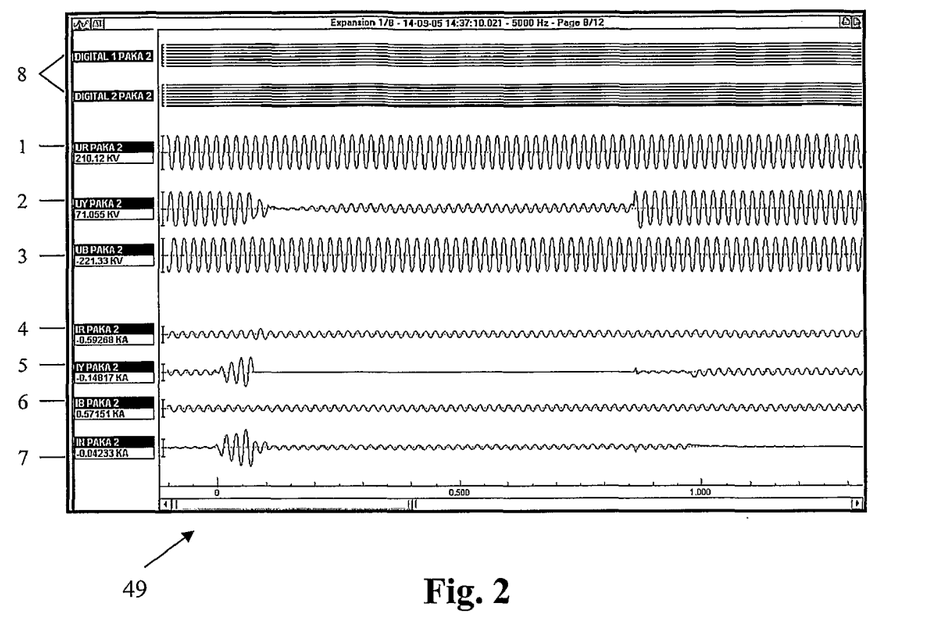
FIG. 2 illustrates an example of a line tripping signal.

Where
$D1_N$: Digital input no 1 at "N" data sampling
$D2_N$: Digital input no 2 at "N" data sampling
$D3_N$: Digital input no 3 at "N" data sampling
and so on until $D16_N$ The two matrices consist of a set of analogue and digital signals reaction during a power system. The values will be used to calculate the response time of the protection system and the total fault clearing time. All these response time values will be validated against a pre-defined value according to the protection philosophy adopted by a user using an Artificial Neural Network (ANN). The ANN has 23 inputs from the digital fault recorder (7 analogues and 16 digital signals), and 7 outputs with 2 hidden layers to calculate the accumulated weights as shown in FIG. 1. A typical data which shows line tripping is shown in FIG. 2.

A performance system analysis is reported (54) showing time calculation from the fault inception until the whole process of fault isolation is complete. The timing calculation philosophy is shown below:

A tripping pattern is collected and analyzed for pattern recognition. For the purpose of this invention, tripping cause can be identified into five faults i.e. lightning (47), tree encroachment (41), crane (44), polluted insulator (46) and current transformer explosion (39). The signature for each fault will be identified and explained.

Figure 3:
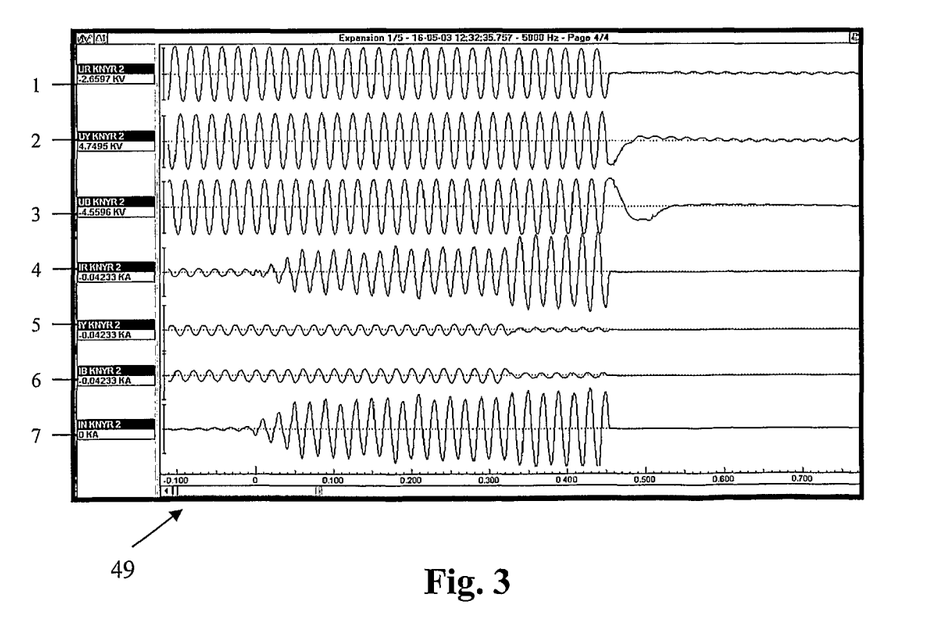
FIG. 3 illustrates an example of a tree encroachment signature.
Figure 4:
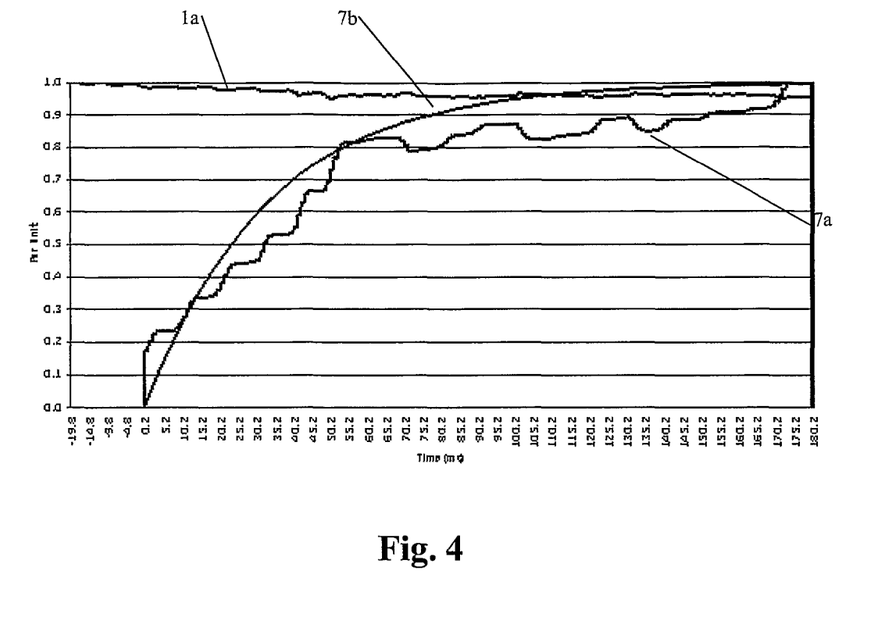
FIG. 4 illustrates an r. m. s. per unit value of neutral current of FIG. 3 compared with a flashover function.

A tree encroachment (41) is a situation where the clearance between the power line conductor and the tree shoot is less than the minimum stipulated distance. A tree encroachment signature is shown in FIG. 3. The neutral current (7) and voltage profile (1, 2, 3) of FIG. 3 is used to for analysis. Both the neutral current (7) and voltage (1, 2, 3) profile is translated into root mean square (r. m. s.) per unit value (1a, 7a) and presented in FIG. 4. By observing FIG. 4, the neutral current (7) can be approximated to model a flashover function (7b) which observes the following equation:

$$f_c(t,\lambda) = 1 - e^{-\lambda t}|_{t=t_0 \to t_n}$$

where
$f_c(t,\lambda)$ is the flashover function with calculated r. m. s. per unit value flashover neutral current for every sample taken with a constant $\lambda$;
e is the exponential curve function;
t is the sampling time in milliseconds;
$t_0$ is the time of initial sampling;
$t_n$ is the 'n' data sampling;
$\lambda$ is the gradient or rate of change of the curve; and
n is the number of sample.

In the case of graph of FIG. 4, a value of $\lambda=0.03$ is obtained. Another observation is the faulty phase voltage (1a), which experience a voltage dip of 0.037 per unit. The significance of these two parameters will be explained later.

Figure 5:
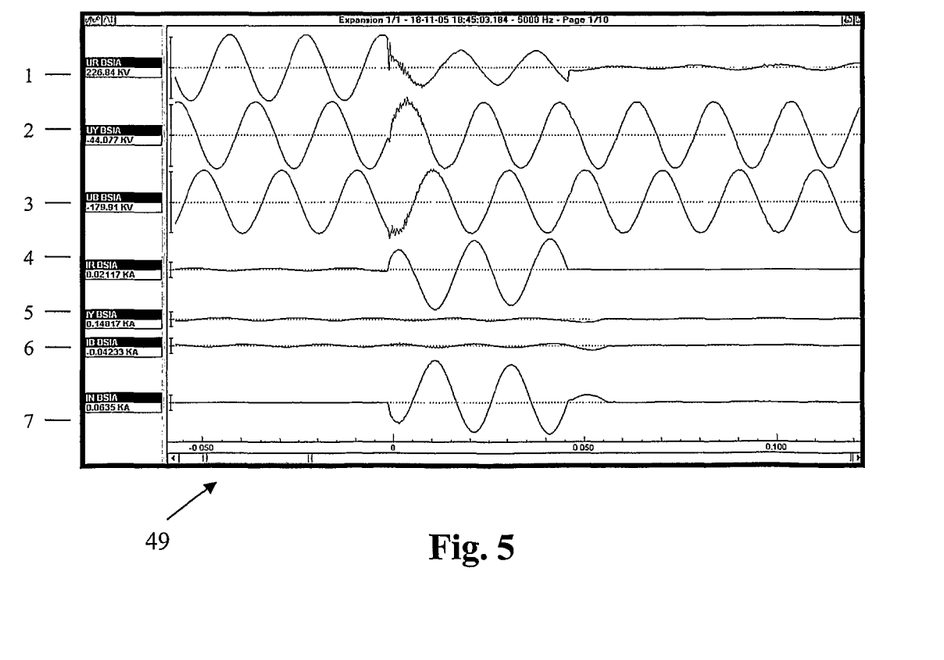
FIG. 5 illustrates an example of a lightning signature.
Figure 6:
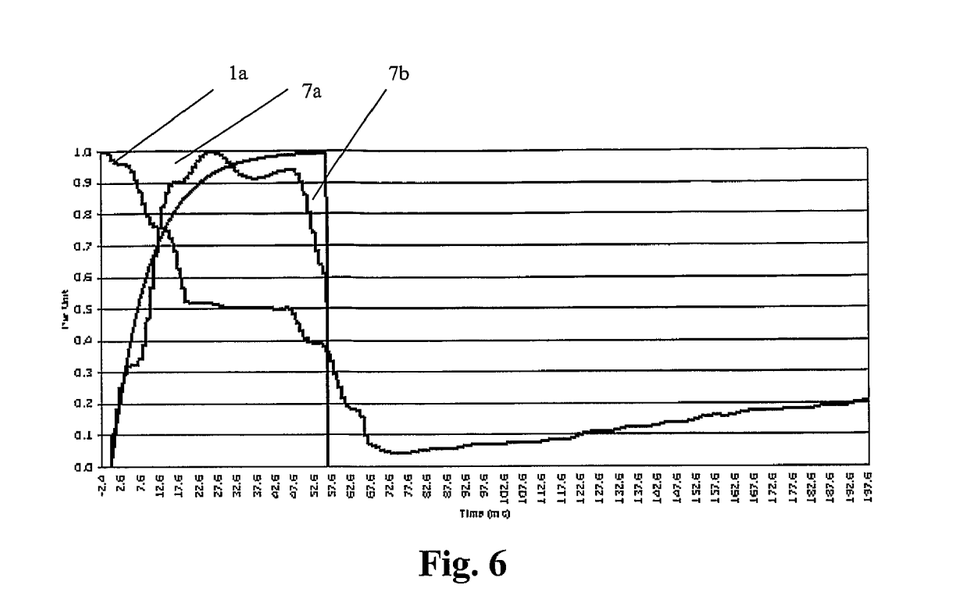
FIG. 6 illustrates an r. m. s. per unit value of neutral current of FIG. 5 compared with the flashover function.

Lightning strike (47) is a phenomenon of electrical discharge in the clouds or between the clouds and ground. A flashover caused by lightning (47) is captured on a digital fault recorder and shown in FIG. 5. The lightning strike signature can be analyzed as the same approach of tree encroachment (41). The neutral current (7) and voltage profile (1, 2, 3) is translated into r. m. s. per unit value as shown in FIG. 6. By approximating the neutral current (7a) with the flashover

| | | |
|---|---|---|
| Pickup time | Main 1 (24) or Main 2 (25) | Time from the fault inception until the main protection pickup |
| | Directional Earth Fault (DEF, 26) | Time from the fault inception until the local DEF pickup |
| | Tele-protection (TP, 28) | Time from the first or second main protection pickup until tele-protection pickup and transmitted to the remote substation |
| Reset time | Main 1 (24) or Main 2 (25) | Time from the fault cleared through circuit breaker opening until the main protection reset. |
| | Directional Earth Fault (DEF, 26) | Time from the fault cleared through a circuit breaker opening until the local DEF reset. |
| | Tele-protection (TP, 28) | Time from the first and second main reset until the tele-protection signal has been cancelled to the remote substation. |
| DEF (26) confirmation time | | An overlapping time between the local DEF pickup and a confirmation signal received from the remote substation |
| Autoreclose dead time (27) | | Time duration between automatic opening and closing of circuit breaker due to a fault. |
| Circuit breaker timing (29) | | Time duration between the first and the last poles of circuit breaker's operation (especially during three-pole operation) |
| Total fault clearance time (TFCT, 30) | | Time from the fault inception until the fault cleared through circuit breaker opening | function (7b), a value of λ=0.10 is obtained. Another observation from the voltage profile (1a) is a voltage dip of 0.244 per unit.

Figure 7:
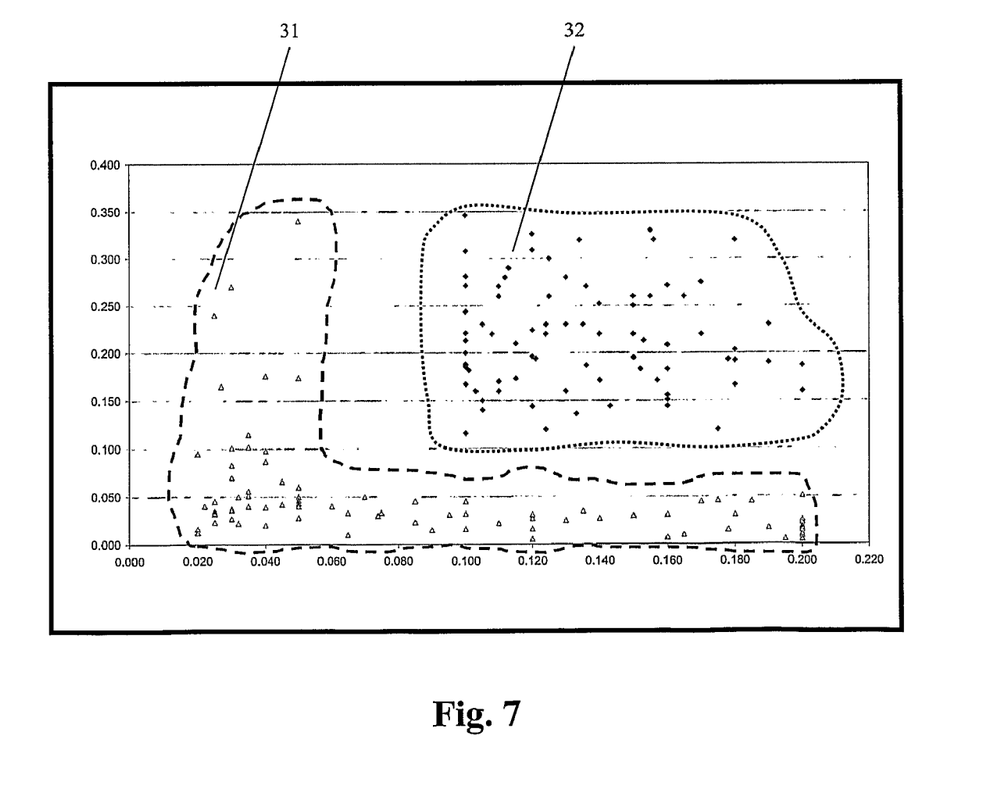
FIG. 7 illustrates a pattern recognition using cluster analysis.

By exploring the value of λ and voltage dip for a large sample of tripping fault, a tripping pattern due to lightning (47) and tree encroachment (41) is observed. The data is shown in FIG. 7. From the cluster analysis, it can be deduced that lightning strike (47) occurs when λ is in a lightning strike region (32) between two λ value and voltage dip above a certain value. In this case, for Malaysian data, lightning strike occurs between λ of 0.10 and 0.20 with a voltage dip of more than 0.100 per unit. Tree encroachment (41) occurs in a tree encroachment region (31) between two λ value and a voltage dip in a certain range. For this case, tree encroachment occurs when λ is between 0.05 and 0.20 with a voltage dip of less than 0.100 per unit and when λ is between 0.01 and 0.05 with a voltage dip ranging between 0.010 and 0.350 per unit.

Figure 9:
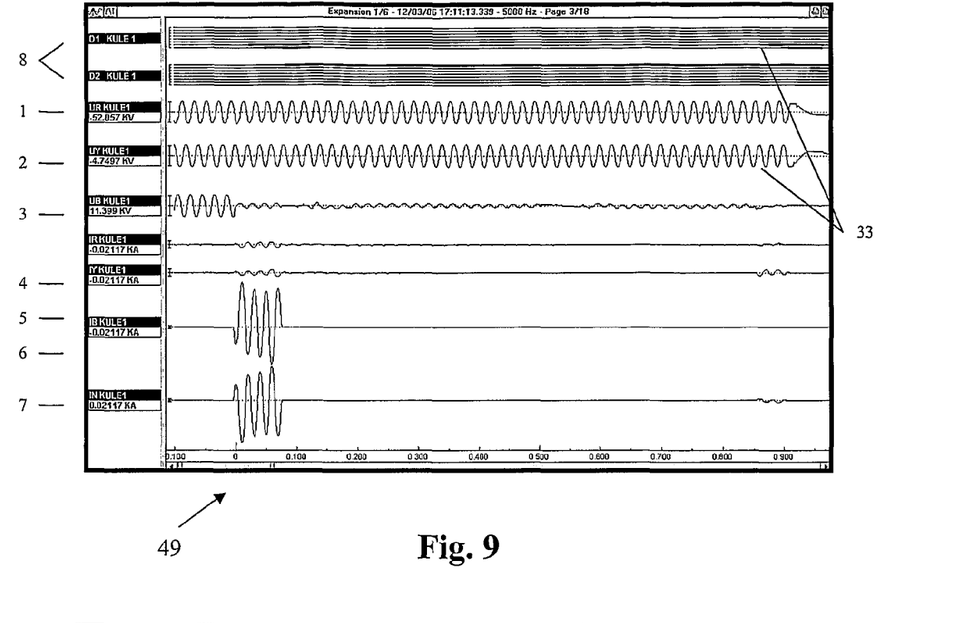
FIG. 9 illustrates an example of a crane signature.

There are other flashover faults which are not caused by tree encroachment and lightning strike. FIG. 9 shows a fault signature caused by crane (44). A crane signature shows a persistent fault (33) during the single pole auto reclosing. By subjecting the neutral current (7) and voltage profile (1, 2, 3) with the flashover function, a value of λ=0.10 and voltage dip of 0.324 per unit is obtained.

Figure 10:
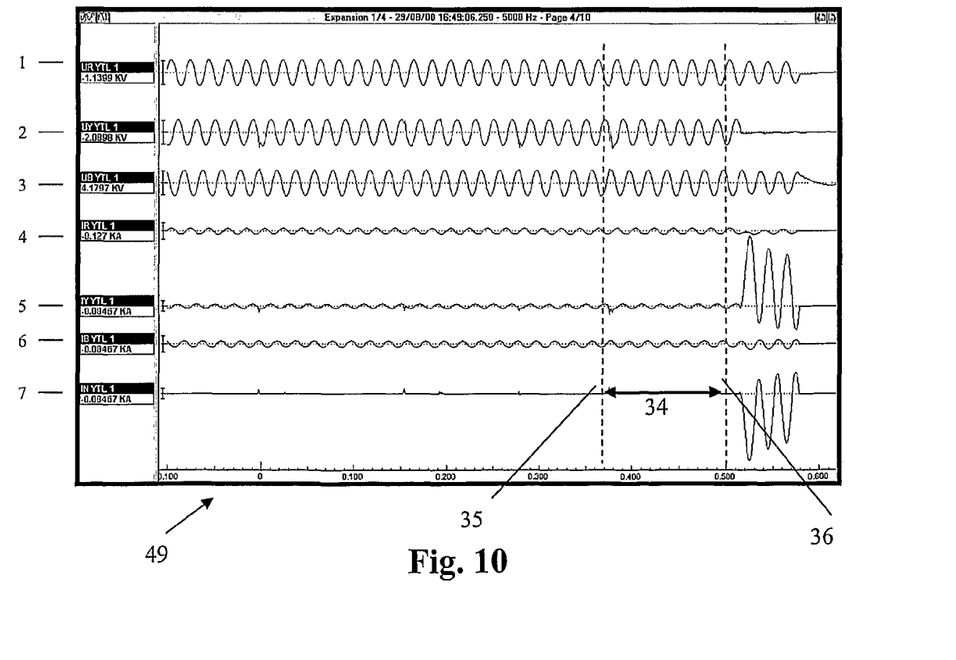
FIG. 10 illustrates an example of a polluted insulator signature.

Polluted insulator (46), another flashover fault, has a distinct flashover signature. The polluted insulator signature has a distinct time interval $\Delta t_f$ (34) between the last neutral current distortion (35) and flashover (36) as shown in FIG. 10. By subjecting the neutral current (7) and voltage profile (1, 2, 3) with the flashover function, a value of λ=0.12 and voltage dip of 0.299 per unit is obtained.

Figure 11:
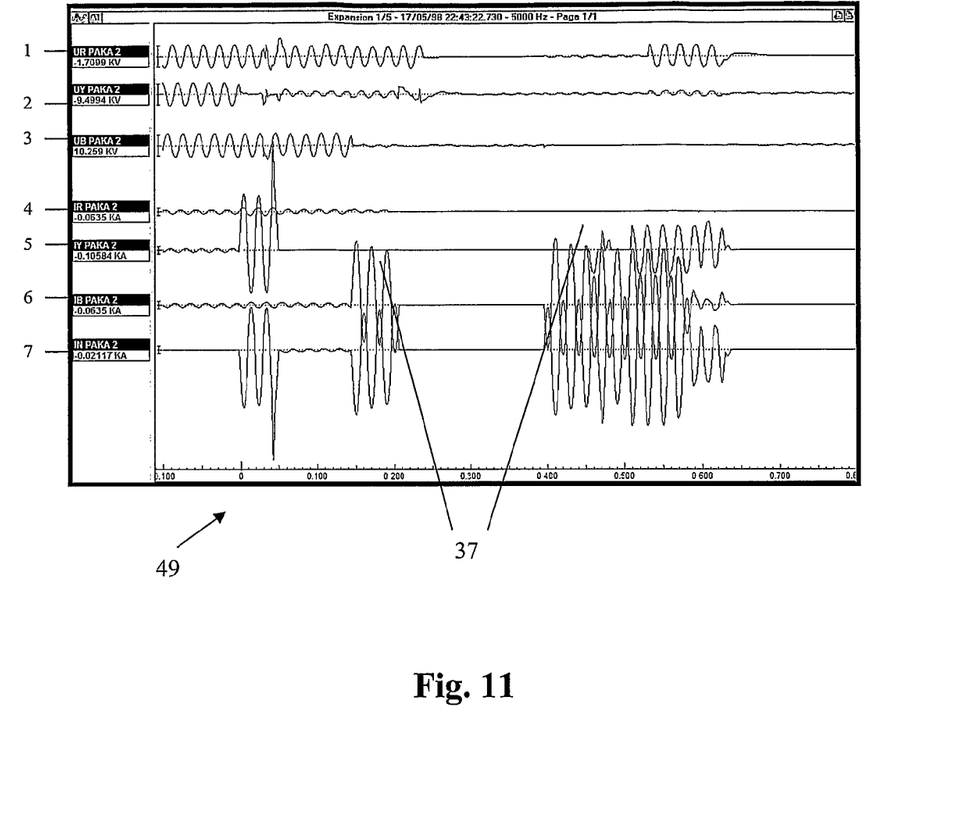
FIG. 11 illustrates an example of a current transformer signature.

Current transformer explosion (39), another flashover fault, also has a distinct flashover signature. The current transformer explosion signature has an evolving fault (37) which occurs on another healthy phase after the clearance of the first detected fault during the dead time of the first fault, as shown in FIG. 11. By subjecting the neutral current (7) and voltage profile (1, 2, 3) with the flashover function, a value of λ=0.10 and voltage dip of 0.311 per unit is obtained.

Figure 8:
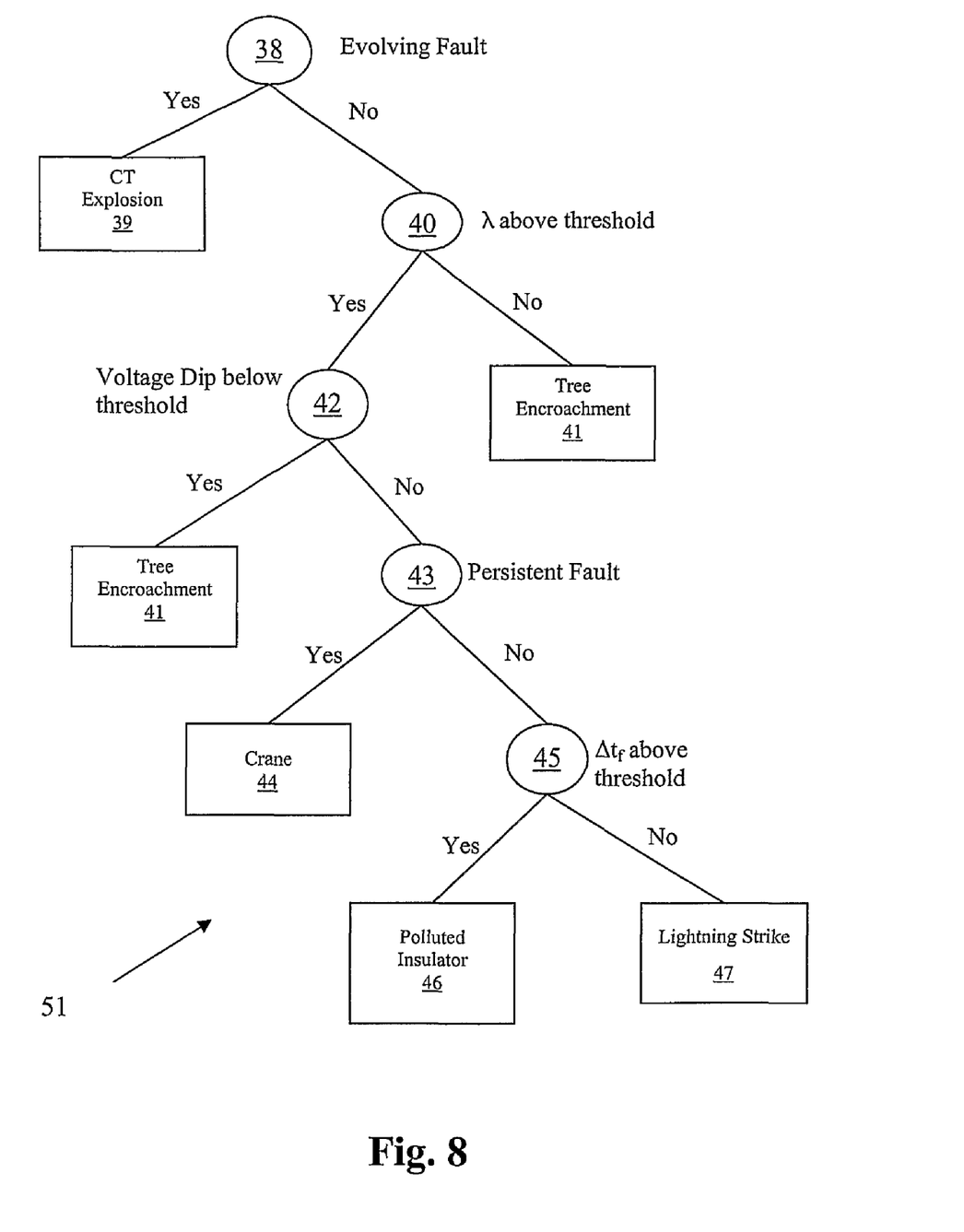
FIG. 8 illustrates the decision making process using decision tree.

A logic system is created to identify the flashover fault in the event of a flashover. The logic is presented in FIG. 8. The first decision process (38) is to decide if the fault is an evolving fault (37). If there's an evolving fault (37) than it is a current transformer explosion (39). If there is no evolving fault than it will be subjected to a second decision process (40) to check if λ is more than a threshold value, in this case 0.100. If λ is not more than 0.100, than the fault is a tree encroachment (41). If λ is more than threshold of 0.100, than it will be subjected to a third decision process (42) to check if voltage dip is less than threshold of 0.100 per unit. If voltage dips is less than threshold of 0.100 per unit than the fault is also a tree encroachment (41). If voltage dip is not less than 0.100 per unit than it will be subjected to a fourth decision process (43) to check if a persistent fault (33) is found. If a persistent fault (33) is found than the fault is caused by crane (44). If there is no persistent fault (33) than it will be subjected to a fifth decision process (45) to check if $\Delta t_f$ (34) is more than threshold of 100 ms. If $\Delta t_f$ (34) is more than threshold of 100 ms than the fault is caused by polluted insulator (46). If $\Delta t_f$ (34) is less than 100 ms, than the fault is caused by lightning strike (47).

Figure 12:
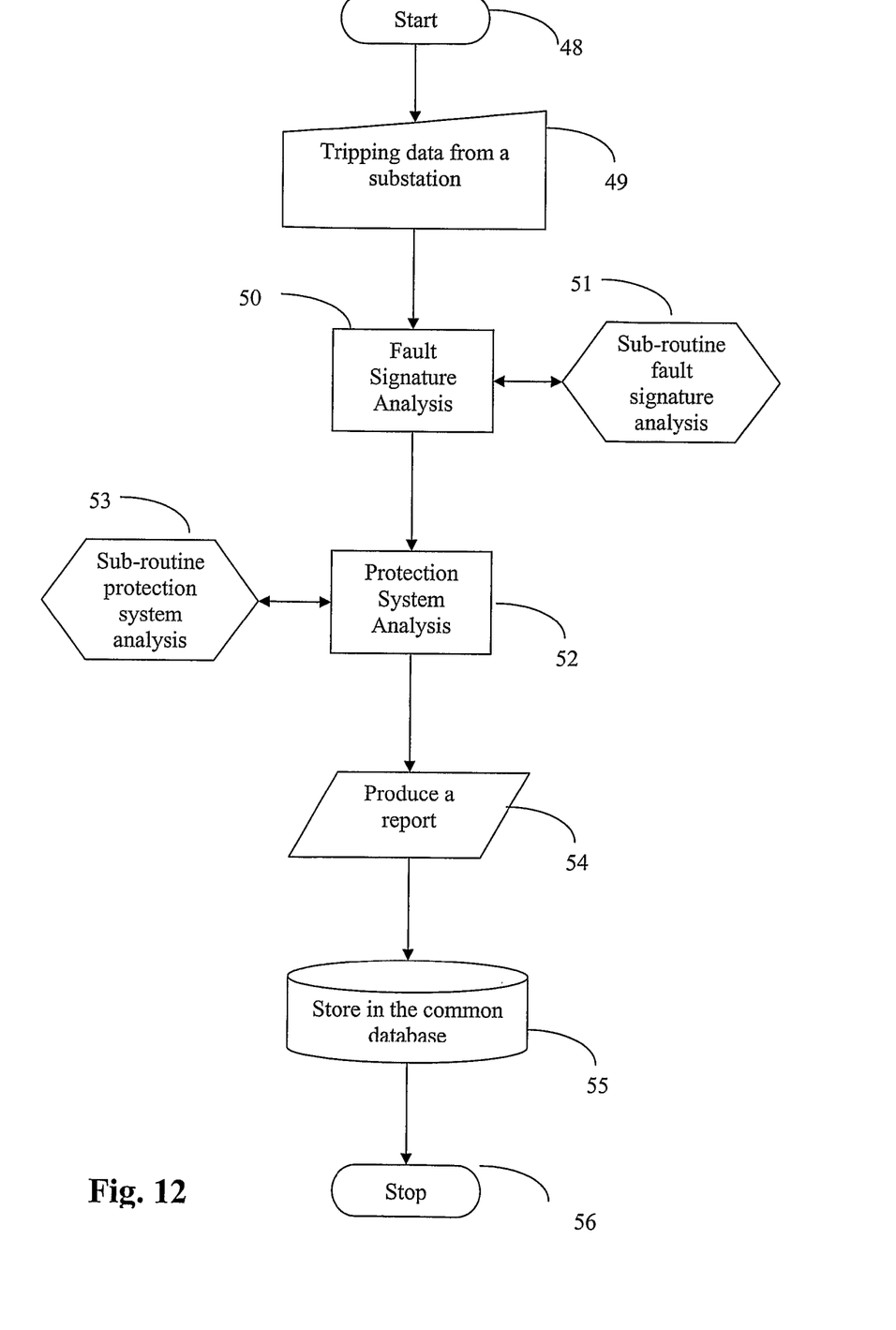
FIG. 12 illustrates the entire invention in the form of a flow chart.

The above mentioned process of fault signature analysis (50) is independent of the protection system analysis (52). Both of the routine is shown on a flow chart in FIG. 12. The system starts (48) to capture data when a flashover occurs. Tripping data (49) from the fault recorder is subjected to a fault signature analysis (50) to identify the cause of fault. A subroutine fault signature analysis (51) identifies the cause of a fault if it is a tree encroachment, lightning strike, current transformer explosion, polluted insulator or crane. The data is also subjected to a protection system analysis (52, 53) to validate protection system timing. After processing, a report (54) is generated and stored on a common database (55). Then, the routine will stop (56). A graphical user interface tool utilizing the internet browser facility to access the system for remote monitoring is used to monitor every transmission line.

The invention claimed is:

1. A method of producing flashover analysis signal comprising processing a neutral current, three phase voltage profile, and a plurality of digital signals of a transmission line to identify a flashover fault caused by tree encroachment, crane, polluted insulator or lightning strike, by obtaining λ, the gradient of neutral current's root mean square value, whereby;

if λ is not more than a threshold value, then the fault is a tree encroachment;

if λ is more than a threshold value, then determine if voltage dip is less than a threshold value;

if voltage dip is less than a threshold value then the fault is also a tree encroachment;

if voltage dip is not less than a threshold value, then determine if a persistent fault is found;

if a permanent fault is found then the fault is caused by crane;

if there is no persistent fault, then determine if $\Delta t_f$ is more than a threshold value;

if $\Delta t_f$ is more than a threshold value then the fault is caused by polluted insulator; and if $\Delta t_f$ is not more than a threshold value, then the fault is caused by lightning strike;

wherein the above-mentioned steps are not restricted by order and $\Delta t_f$ is the time interval between the last current distortion and a flashover.

2. A method of producing flashover analysis signal according to claim 1, wherein λ threshold is preferably 0.100.

3. A method of producing flashover analysis signal according to claim 1, wherein voltage dip threshold is preferably 0.100 per unit.

4. A method of producing flashover analysis signal according to claim 1, wherein $\Delta t_f$ threshold is preferably 100 ms.

* * * * *